United States Patent
Sugita et al.

(10) Patent No.: US 11,434,421 B2
(45) Date of Patent: Sep. 6, 2022

(54) PHOSPHOR AND LIGHT-EMITTING DEVICE

(71) Applicant: DENKA COMPANY LIMITED, Tokyo (JP)

(72) Inventors: Kazuya Sugita, Omuta (JP); Yusuke Takeda, Omuta (JP); Keita Kobayashi, Omuta (JP); Akihisa Kajiyama, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 9 days.

(21) Appl. No.: 17/272,878

(22) PCT Filed: Aug. 22, 2019

(86) PCT No.: PCT/JP2019/032908
§ 371 (c)(1),
(2) Date: Mar. 2, 2021

(87) PCT Pub. No.: WO2020/054351
PCT Pub. Date: Mar. 19, 2020

(65) Prior Publication Data
US 2021/0324267 A1    Oct. 21, 2021

(30) Foreign Application Priority Data

Sep. 12, 2018    (JP) .............................. JP2018-170875

(51) Int. Cl.
*H01L 33/50* (2010.01)
*C09K 11/77* (2006.01)

(52) U.S. Cl.
CPC ...... *C09K 11/77348* (2021.01); *H01L 33/502* (2013.01)

(58) Field of Classification Search
CPC ..................................................... H01L 33/50
See application file for complete search history.

(56) References Cited

U.S. PATENT DOCUMENTS

| | | |
|---|---|---|
| 2004/0135504 A1 | 7/2004 | Tamaki et al. |
| 2006/0038477 A1 | 2/2006 | Tamaki et al. |
| 2007/0007494 A1 | 1/2007 | Hirosaki et al. |
| 2008/0089825 A1 | 4/2008 | Tamaki et al. |
| 2009/0072708 A1 | 3/2009 | Tamaki et al. |
| 2009/0230840 A1 | 9/2009 | Tamaki et al. |
| 2009/0284132 A1 | 11/2009 | Tamaki et al. |
| 2009/0309485 A1 | 12/2009 | Tamaki et al. |
| 2010/0053932 A1 | 3/2010 | Emoto et al. |
| 2010/0231121 A1 | 9/2010 | Kaneda et al. |
| 2013/0168606 A1 | 7/2013 | Hirosaki et al. |
| 2015/0275082 A1 | 10/2015 | Hirosaki et al. |
| 2016/0060517 A1 | 3/2016 | Pohl-Klein et al. |
| 2017/0283261 A1 | 10/2017 | Hirosaki et al. |
| 2019/0127638 A1 | 5/2019 | Hirosaki et al. |

FOREIGN PATENT DOCUMENTS

| | | |
|---|---|---|
| JP | 2004-071726 A | 3/2004 |
| JP | 2006-332202 A | 12/2006 |
| JP | 2008-285662 A | 11/2008 |
| JP | 2009-013186 A | 1/2009 |
| JP | 2012-052127 A | 3/2012 |
| JP | 2013-170184 A | 9/2013 |
| JP | 2016-527163 A | 9/2016 |
| JP | 2018-150432 A | 9/2018 |
| WO | 2005/052087 A1 | 6/2005 |
| WO | 2018/092696 A1 | 5/2018 |

OTHER PUBLICATIONS

Oct. 8, 2019 International Search Report issued in International Patent Application No. PCT/JP2019/032908.

*Primary Examiner* — Vip Patel

(74) *Attorney, Agent, or Firm* — Oliff PLC

(57) ABSTRACT

A phosphor which has a main crystal phase having the same crystal structure as that of $CaAlSiN_3$, wherein the phosphor satisfies conditions of a span value (d90−d10)/d50 of 1.70 or less and a d50 of 10.0 μm or less, as represented with d10, d50, and d90 on a volume frequency measured according to a laser diffraction method; wherein the d10, d50, and d90 on a volume frequency in a particle distribution measured are each a measured by loading 0.5 g of a phosphor into 100 ml of a solution of 0.05% by weight of sodium hexametaphosphate mixed in ion exchange water, and subjecting the resultant to a dispersing treatment for 3 minutes with an ultrasonic homogenizer at an oscillation frequency of 19.5±1 kHz, a chip size of 20φ, and an amplitude of vibration of 32±2 μm, with a chip placed at a central portion.

5 Claims, No Drawings

PHOSPHOR AND LIGHT-EMITTING DEVICE

TECHNICAL FIELD

The invention relates to a phosphor and a light-emitting device using the phosphor. More specifically, it relates to a red phosphor high in brightness, which may be preferably used for LED (also referred to as "light emitting diode") or LD (also referred to as "laser diode"), and a light-emitting device using the red phosphor.

BACKGROUND ART

A white LED is a device which emits pseudo white light by a combination of a semiconductor light-emitting element and a phosphor, and a representative example known is a combination of a blue LED and a YAG yellow phosphor. However, such a type of white LED, although the chromaticity coordinate value thereof is in the white region, is deficient in a red light-emitting component and thus has the problems of being low in color rendering properties when applied to lighting and of being poor in color reproducibility when used in an image display device such as a liquid crystal backlight. Patent Literature 1 has proposed combination use of a nitride or oxynitride phosphor which emits red light, with a YAG phosphor, in order to compensate a deficient red light-emitting component.

A known nitride phosphor which emits red light is one where an inorganic compound having the same crystal structure as that of $CaAlSiN_3$ (also generally designated as "CASN"), as a mother crystal, is activated by an optically active element such as $Eu^{2+}$. Patent Literature 2 has described a phosphor obtained by activating a mother crystal of CASN by $Eu^{2+}$ (namely, Eu-activated CASN phosphor), which emits light at high brightness. The color emitted from the Eu-activated CASN phosphor is high in spectrum component at a longer wavelength even in a red region, and thus high and deep color rendering properties may be realized.

Patent Literature 2 has further described a phosphor obtained by activating a mother crystal (also generally designated as "SCASN") also designated as $(Sr, Ca)AlSiN_3$ where Ca of the $CaAlSiN_3$ is partially replaced further with Sr, by $Eu^{2+}$ (namely, Eu-activated SCASN phosphor). The Eu-activated SCASN phosphor exhibits a shift of the peak wavelength of light, to a shorter wavelength, to result in an increase of a spectrum component in a high luminous region, as compared with the Eu-activated CASN phosphor, and thus has promise as a red phosphor for high brightness white LEDs.

CITATION LIST

Patent Literatures

Patent Literature 1: Japanese Patent Laid Open No. 2004-071726
Patent Literature 2: International Publication No. WO 2005/052087

SUMMARY OF INVENTION

Technical Problem

Downsizing of LEDs for use in liquid crystal displays currently progresses. Phosphors for use in mini-LEDs and micro-LEDs as downsized LEDs have a particle size of about several hundred nm to several μm. While a decreased particle size may allow color variability and color deviation to be prevented, an excessive small particle size causes scattering of light to be strengthened, resulting in a reduction in rate of absorption of excitation light. An excessive small particle considerably generated in pulverization has many defects generated by pulverization and includes many defects absorbing light, and thus a problem is that the internal quantum efficiency is reduced.

A main object of the invention is to provide a phosphor which, while has a small particle size, for example, a d50 of 10 μm or less, has a relatively uniform particle size, and enables a high internal quantum efficiency and a high light absorptivity to be maintained.

Solution to Problem

The inventors have made intensive studies in order to solve the above problems, and as a result, have found that the above problems are solved by a phosphor where the upper limit value of a span value described below and the range of d50 are defined, thereby leading to the invention. That is, the invention may be specified as follows.

(1) A phosphor which has a main crystal phase having the same crystal structure as that of $CaAlSiN_3$ and which is represented by general formula $MAlSiN_3:Eu$ where M represents one or more elements selected from Sr, Mg, Ca, and Ba, wherein the phosphor satisfies conditions of a span value (d90−d10)/d50 of 1.70 or less and a d50 of 10.0 μm or less, as represented with d10, d50, and d90 (each unit is [μm]) on a volume frequency basis in a particle size distribution measured according to a laser diffraction scattering method;

wherein the d10, d50, and d90 on a volume frequency basis in a particle size distribution measured according to the laser diffraction scattering method are each a measurement value obtained with a liquid obtained by loading 0.5 g of a phosphor for measurement, into 100 ml of a solution of 0.05% by weight of sodium hexametaphosphate mixed in ion exchange water, and subjecting the resultant to a dispersing treatment for 3 minutes with an ultrasonic homogenizer at an oscillation frequency of 19.5±1 kHz, a chip size of 20φ, and an amplitude of vibration of 32±2 μm, with a chip being placed at a central portion of the liquid.

(2) The phosphor according to (1), wherein a value of d50/d1 represented by the d50 and an average particle size d1 calculated from a specific surface area measured according to a BET method is 21.0 or less.

(3) The phosphor according to (1) or (2), wherein an oxygen content rate is 2.70% by mass or less.

(4) The phosphor according to any one of (1) to (3), wherein a light absorptivity at 700 nm is 5.5% or less.

(5) The phosphor according to any one of (1) to (4), wherein a particle size d100 at an accumulation of 100% on a volume basis in a particle size distribution measured according to a laser diffraction scattering method is 24.0 μm or less.

(6) A light-emitting device including a LED, a phosphor sheet, or a phosphor plate including the phosphor according to any one of (1) to (5).

Advantageous Effect of Invention

According to the invention, there may be provided a phosphor which, while has a small particle size, has a relatively uniform particle size, and allows not only a high internal quantum efficiency, but also a high light absorptivity of excitation light, to be maintained.

DESCRIPTION OF EMBODIMENTS

Hereinafter, the invention will be described with reference to specific embodiments, but the scope of the invention is not limited to any specific embodiment.

Composition of Phosphor

The phosphor of the invention has a main crystal phase having the same crystal structure as that of $CaAlSiN_3$, and is represented by general formula $MAlSiN_3$:Eu where M represents one or more elements selected from Sr, Mg, Ca, and Ba. One example is a phosphor represented by general formula $(Ca, Eu)SiAlN_3$ (namely, $CaSiAlN_3$:Eu). The phosphor is formed by binding of a (Si, Al)—$N_4$ regular tetrahedron, and a Ca element is located in any space. Such a composition allows electroneutrality to be kept by a combination of parameters of the Ca element occupancy, the Si/Al ratio, and the N/0 ratio. A representative phosphor that approximates the general formula is $CaAlSiN_3$ where the Ca site occupancy is 100% and Si/Al=1 and O/N=0 are satisfied. In a case where $Ca^{2+}$ of $CaAlSiN_3$ is partially replaced with $Eu^{2+}$ acting as the light-emitting center, a red light-emitting phosphor is obtained. Another phosphor is $(Ca_{1-x}, Sr_x)AlSiN_3$ where the Ca site occupancy is 5 to 60%, Ca is replaced with Sr to form a solid solution, and Si/Al=1 and O/N=0 are satisfied. In a case where $Ca^{2+}$ of $(Ca_{1-x}, Sr_x)AlSiN_3$ is partially replaced with $Eu^{2+}$ acting as the light-emitting center, a red light-emitting phosphor is obtained.

Whether or not the main crystal phase of the phosphor of the invention is the same crystal structure as that of a $CaAlSiN_3$ crystal may be confirmed by powder X-ray diffraction. A case where the crystal structure is different from that of $CaAlSiN_3$ is not preferable because the emission color is not red or the brightness is considerably reduced. Accordingly, the present phosphor may preferably be a single phase to which a crystal phase (also referred to as "heterophase") other than the main crystal phase is not incorporated whenever possible, and may include a heterophase as long as phosphor characteristics are not significantly affected.

Particle Size Distribution and Span Value

The phosphor of the invention satisfies a span value $(d90-d10)/d50$ of 1.70 or less represented with d10 as a value at an accumulation of 10%, d50 as a value at an accumulation of 50%, and d90 as a value at an accumulation of 90% (each unit is [μm]) on a volume frequency basis in a particle size distribution measured according to a laser diffraction scattering method. The span value is a value serving as an index representing the width of spreading of a particle size distribution, and a span value of more than the upper limit value prescribed in the present specification, specifically 1.70, results in a large variation in particle size and a reduction in absorption efficiency of excitation light of the phosphor. A large span value decreases d10 relative to d50 and increases the proportion of an ultrafine particle, and causes light to be scattered or reflected by such an ultrafine particle in LED formation and causes light to migrate in such a LED before emission of light outside such a LED, thereby resulting in light attenuation (change to heat or the like) by a reflector, a resin, and/or the like to easily cause the brightness of the entire LED to be reduced. Such a tendency is again observed also in a phosphor sheet produced by mixing the phosphor and a resin. In a case where the phosphor sheet is irradiated with blue excitation light to measure transmitted light and fluorescence of the excitation light, emitted from the opposite, and the fluorescence is compared with the excitation light for irradiation in terms of proportion, a phosphor which is large in span value, namely, which includes a large amount of the ultrafine particle, is reduced in proportion of the fluorescence relative to the excitation light. Herein, the "ultrafine particle" means a particle having a particle size of 0.2 μm or less.

Particle Size d50

In a case where the d50 (d50 is also commonly referred to as "median size" or "median diameter") of the phosphor is excessively large, specifically, more than 10.0 μm, the variation in chromaticity easily occurs in the emission color of a LED to which the phosphor is applied. Accordingly, the range of d50 in the present phosphor may be 10.0 μm or less, more preferably 7.5 μm or less.

Particle Sizes d90 and d100

In a case where the d90 is excessively large, specifically, more than 9.0 μm, the variation in chromaticity may easily occur in the emission color of a LED to which the phosphor is applied. Accordingly, the d90 in the phosphor of the embodiment may preferably be 9.0 μm or less.

In a case where the particle size d100 (the unit is [μm]) at an accumulation of 100% on a volume frequency basis in a particle size distribution measured according to a laser diffraction scattering method, in the phosphor of the embodiment, is excessively large, specifically, more than 24.0 μm, the variation may easily occur in the emission color of a LED to which the phosphor is applied. Accordingly, the d100 in the phosphor of the embodiment may preferably be 24.0 μm or less. Herein, a particle having a particle size of more than 24.0 μm may be sometimes called "coarse powder".

In a case where the particle size of a powder is measured according to a laser diffraction scattering method, it is important to eliminate aggregation of the powder before the measurement to thereby sufficiently disperse the powder in a dispersion medium. Since any differences in dispersion conditions sometimes lead to any difference in measurement value, the measurement values of d10, d50, d90, and the like of the phosphor of the invention, according to a laser diffraction scattering method, are defined as measurement values obtained with a liquid obtained by loading 0.5 g of a phosphor for measurement, into 100 ml of a solution of 0.05% by weight of sodium hexametaphosphate mixed in ion exchange water, and subjecting the resultant to a dispersing treatment for 3 minutes with an ultrasonic homogenizer at an oscillation frequency of 19.5±1 kHz, a chip size of 20φ, and an amplitude of vibration of 32±2 μm, with a chip being placed at a central portion of the liquid. A designation of 19.5±1 represents the range of 18.5 or more and 20.5 or less, and a designation of 32±2 represents the range of 30 or more and 34 or less.

d50/d1

The value of d50/d1 of the d50 and the average particle size d1 calculated from the specific surface area measured according to a BET method, in the phosphor of the embodiment, may preferably be 21.0 or less because an ultrafine particle having an adverse effect on light absorptivity is less present.

Oxygen Content Rate

In a case where the oxygen content rate in the phosphor of the embodiment is in the range of 2.70% by mass or less, a phosphor higher in absorption efficiency of excitation light is obtained and is further enhanced in light-emitting efficiency, and thus the oxygen content rate may preferably be 2.70% by mass or less, more preferably 2.50% by mass or less.

Light Absorptivity at 700 nm

The phosphor of the invention preferably has a light absorptivity at 700 nm of 5.5% or less. Light at 700 nm is light at a wavelength where there is originally no absorption by Eu as an activate element of the phosphor of the invention, and a light absorptivity at 700 nm of more than 5.5% may cause crystal defects and a heterophase to be present to such an extent that the effects of the invention are impaired.

Another aspect of the present embodiment may relate to a light-emitting device including a LED, a phosphor sheet, or a phosphor plate including the phosphor of the invention. A light-emitting device using such a phosphor may realize a high brightness.

A phosphor for use in a mini-LED or a micro-LED, when has a small particle size and includes a large amount of an ultrafine particle having, for example, a particle size of 0.2 μm or less, causes light scattering and reflection due to such an ultrafine particle to be increased, resulting in a reduction in rate of absorption of excitation light. Such an ultrafine particle is mostly generated in pulverization, and any defect absorbing light in such an ultrafine particle is increased by pulverization to thereby result in a reduction in internal quantum efficiency. A coarse powder having a particle size of more than 24.0 μm is also not preferable as described above. The method for producing the present phosphor is not particularly limited. For example, any physical measure for removal of such an ultrafine particle or coarse powder may be preferably adopted, for example, classification or decantation with a sieve, or a cyclonic classifier utilizing the difference in centrifugal force acting on a particle depending on the particle size. Alternatively, production conditions in a firing step, for example, the compounding ratio in a raw material mixture, the firing temperature, the firing time, and the firing pressure may also have any influence on the particle size of the phosphor. For example, a lower firing temperature, a shorter firing time, or a higher firing pressure suppresses particle growth of the phosphor and decreases the particle size. Thus, it is preferable to not only adjust production conditions in a firing step, but also appropriately combines a fired product obtained in a firing step with the above physical measure.

EXAMPLES

Hereinafter, the invention will be described with reference to Examples and Comparative Examples. However, the phosphor of the invention is not intended to be limited to any phosphor produced according to a specified method. Examples 1 to 4 and Comparative Examples 1 to 5 each provided an Eu-activated CASN phosphor, and Example 5 and Comparative Examples 6 to 8 each provided an Eu-activated SCASN phosphor.

Example 1

A phosphor of Example 1 was produced through each step described below in detail: a mixing step of mixing starting materials to provide a raw material-mixed powder, a firing step of firing the raw material-mixed powder, and an acid treatment step of removing impurities from the powder after the firing step. It is noted that a decantation step of removing further an ultrafine particle from the powder after the acid treatment step, and a step of pulverizing or grinding with a ball mill or a mortar were provided in some Examples and Comparative Examples among Examples and Comparative Examples other than Example 1.

Mixing Step

Mixed were 33.90% by mass of an α-type silicon nitride powder ($Si_3N_4$, SN-E10 grade, manufactured by Ube Industries, Ltd.), 35.61% by mass of a calcium nitride powder ($Ca_3N_2$, manufactured by Taiheiyo Cement Corporation), 29.72% by mass of an aluminum nitride powder (AlN, E grade, manufactured by Tokuyama Corporation), and 0.77% by mass of a europium oxide powder ($Eu_2O_3$, manufactured by Nippon Yttrium Co., Ltd.) in a glove box retained in a nitrogen atmosphere at a water content of 1 ppm by mass or less and an oxygen content of 1 ppm by mass or less, thereby obtaining a raw material-mixed powder. Into a tungsten container with a lid was packed 220 g of the raw material-mixed powder.

Firing Step

The container into which the raw material-mixed powder was packed was taken out from the glove box and rapidly installed in an electrical furnace equipped with a carbon heater, and the furnace was sufficiently vacuum evacuated to 0.1 PaA or less. Heating was started with such vacuum evacuation being continued, a nitrogen gas was introduced into the furnace after the temperature reached 850° C., and the atmosphere pressure in the furnace was constant at 0.13 MPaG. A nitrogen gas was constantly introduced or discharged to constantly discharge a volatile component from the raw material. The temperature was continued to be raised to 1750° C. even after introduction of a nitrogen gas, firing for 4 hours was performed at the firing retention temperature, and thereafter heating was terminated and cooling was made. After cooling to room temperature, a red block object recovered from the container was ground by a mortar, and thereafter allowed to pass through a sieve having an aperture of 250 μm, thereby finally obtaining a powder.

Acid Treatment Step

An acid treatment was performed in order to remove impurities which remained in the powder passing through the sieve and which were generated in firing. In other words, an acid treatment was performed where the powder passing through the sieve was immersed in 0.5 M hydrochloric acid so that the powder concentration was 25% by mass, and furthermore boiled for 1 hour with stirring. Thereafter, the powder was separated from a hydrochloric acid liquid and subjected to washing at a room temperature of about 25° C., and dried in a drier at 100° C. to 120° C. for 12 hours. The powder after drying was classified by a sieve having an aperture of 75 μm, thereby obtaining a phosphor of Example 1. Conditions with respect to the production method were described in Table 1.

Examples 2 to 4

Each phosphor of Examples 2 to 4 was one median size d50 of which was changed as shown in Table 1, as compared with the phosphor of Example 1. The firing times in firing were 8 hours, 12 hours, and 15 hours, respectively, as shown in Table 1 to Table 3 in order to change the d50 of such each phosphor. Other steps were performed according to the same methods and treatments as in Example 1, thereby obtaining each of phosphors of Examples 2 to 4.

Comparative Examples 1 to 4

A mixed powder obtained by mixing the same type of the raw material powder used in Example 1, at each compounding ratio shown in Table 1, was used, the atmosphere pressure in the furnace in the firing step was set to 0.13 MPaG, firing was made at a retention temperature of 1850° C., and the resultant was retained for 8 hours. The other steps were performed according to the same methods and treatments as in Example 1 except that an operation described below was added and performed, and thus each phosphor of Comparative Examples 1 to 4 was obtained. The operation added and performed was an operation where ball mill pulverization with an alumina ball having a diameter of 5 mm was performed for 8 hours in Comparative Example 1, for 12 hours in Comparative Example 2, for 4 hours in Comparative Example 3, or for 3 hours in Comparative Example 4, after operations corresponding to the acid treatment, the acid liquid separation, and the drying in Example 1 and before an operation corresponding to classification of the powder after drying, with a sieve having an aperture of 75 μm.

Comparative Example 5

A mixed powder obtained by mixing the same type of the raw material powder used in Example 1, at each compounding ratio shown in Table 1, was used, the retention temperature and the retention time in the firing step were set to 1950° C. and 4 hours, respectively, and the other steps were performed according to the same methods and treatments as in Example 2, thereby obtaining a phosphor of Comparative Example 5.

Example 5

Mixing Step

Mixed were 25.53% by mass of an α-type silicon nitride powder ($Si_3N_4$, SN-E10 grade, manufactured by Ube Industries, Ltd.), 2.43% by mass of a calcium nitride powder ($Ca_3N_2$, manufactured by Taiheiyo Cement Corporation), 43.91% by mass of a strontium nitride powder ($Sr_2N$, manufactured by Materion Corporation), 22.38% by mass of an aluminum nitride powder (AlN, E grade, manufactured by Tokuyama Corporation), and 5.76% by mass of a europium oxide powder ($Eu_2O_3$, manufactured by Nippon Yttrium Co., Ltd.) in a glove box retained in a nitrogen atmosphere at a water content of 1 ppm by mass or less and an oxygen content of 1 ppm by mass or less, thereby obtaining a raw material-mixed powder. Into a tungsten container with a lid was packed 220 g of the raw material-mixed powder.

Firing Step

The container into which the raw material-mixed powder was packed was taken out from the glove box and rapidly installed in an electrical furnace equipped with a carbon heater, and the furnace was sufficiently vacuum evacuated to 0.1 PaA or less. Heating was started with such vacuum evacuation being continued, a nitrogen gas was introduced into the furnace after the temperature reached 850° C., and the atmosphere pressure in the furnace was constant at 0.80 MPaG. A nitrogen gas was constantly introduced or discharged to constantly discharge a volatile component from the raw material. The temperature was continued to be raised to 1950° C. even after introduction of a nitrogen gas, firing for 8 hours was performed at the firing retention temperature, and thereafter heating was terminated and cooling was made. After cooling to room temperature, a red block object recovered from the container was subjected to ball mill pulverization with an alumina ball having a diameter of 5 mm for 5 hours, and thereafter allowed to pass through a sieve having an aperture of 250 μm, thereby finally obtaining a powder.

Acid Treatment Step

An acid treatment was performed in order to remove impurities which remained in the powder passing through the sieve and which were generated in firing. In other words, an acid treatment was performed where the powder passing through the sieve was immersed in 1.0 M hydrochloric acid so that the powder concentration was 25% by mass, and furthermore boiled for 1 hour with stirring. Thereafter, a hydrochloric acid liquid and an ultrafine particle were removed by decantation at a room temperature of about 25° C. A dispersion medium used in the decantation was an aqueous solution of 0.05% by weight of Na hexametaphosphate mixed in ion exchange water. The precipitation time of the particle was calculated according to the Stokes' equation, and any supernatant including a particle of 2 μm or less was removed and discharged after a predetermined time from the start of precipitation, thereby partially removing the ultrafine particle. The decantation operation was repeatedly performed three times. The resulting powder was dried in a drier at 100° C. to 120° C. for 12 hours, and the powder after drying was classified by a sieve having an aperture of 75 μm, thereby obtaining a phosphor of Example 5.

Comparative Example 6

No classification by decantation after the acid treatment was performed, and the other steps were performed according to the same methods and treatments as in Example 5, thereby obtaining a phosphor of Comparative Example 6.

Comparative Example 7

Firing was performed using a mixed powder obtained by mixing the same type of the raw material powder used in Example 1, at each compounding ratio shown in Table 4. No ball mill pulverization in Example 5 was performed, grinding by a mortar was performed instead, decantation conditions were changed so that any supernatant including a particle of 9 μm or less was removed and discharged, the firing temperature was changed to 1900° C., and the other steps were performed according to the same methods and treatments as in Example 5, thereby obtaining a phosphor of Comparative Example 7.

Comparative Example 8

No removal of the ultrafine particle by decantation after the acid treatment step was performed, and the other steps were performed according to the same methods and treatments as in Comparative Example 7, thereby obtaining a phosphor of Comparative Example 8.

Confirmation of Crystal Structure

The crystal structure of each phosphor obtained in Examples and Comparative Examples was confirmed by a powder X-ray diffraction pattern with CuKα ray by use of an X-ray diffractometer (UltimaIV manufactured by Rigaku Corporation). As a result, the same diffraction pattern as that of a $CaAlSiN_3$ crystal was observed in the powder X-ray diffraction pattern of each of the phosphors of Examples and Comparative Examples, and such each phosphor obtained in Examples and Comparative Examples was confirmed to satisfy the fact that a main crystal phase thereof had the same crystal structure as that of $CaAlSiN_3$.

Measurement of Particle Size Distribution

Each particle size distribution of Examples and Comparative Examples was measured with a particle size distribution measurement apparatus (Microtrac MT3000II manufactured by MicrotracBEL Corp.) according to JIS R1622 and R1629, thereby calculating the d10, d50, d90, and d100. In a case where the particle size of a powder was here measured according to a laser diffraction/scattering method, it was important to eliminate aggregation of the powder before the measurement to thereby sufficiently disperse the powder in a dispersion medium. Since any differences in dispersion conditions sometimes leaded to any difference in measurement value, the measurement values of d10, d50, d90, and the like of the β-type sialon phosphor of the invention, according to a laser diffraction/scattering method, were determined with a liquid obtained by loading 0.5 g of a phosphor for measurement, into 100 ml of a solution of 0.05% by weight of sodium hexametaphosphate mixed in ion exchange water, and subjecting the resultant to a dispersing treatment for 3 minutes with an ultrasonic homogenizer (US-150E, manufactured by Nippon Seiki Co., Ltd.) at an amplitude of 100%, an oscillation frequency of 19.5±1 kHz, a chip size of 20φ, and an amplitude of vibration of 32±2 μm, with a chip being placed at a central portion of the liquid. Here, a designation of 19.5±1 represents the range of 18.5 or more and 20.5 or less, and a designation of 32±2 represents the range of 30 or more and 34 or less.

Measurement of Specific Surface Area and Average Particle Size d1 According to BET Method The specific surface area was determined according to specific surface area measurement of a powder (solid) according to gas adsorption of JIS Z8830:2013, with a specific surface area measurement apparatus (Macsorb HM-1201 model manufactured by Mountech Co., Ltd.). The method for measuring the amount of adsorption of gas, here adopted, was the 6.3.4 carrier gas method of the same JIS 28830. Analysis of the adsorption data, here adopted, was the 7.3 one point method of the same JIS Z8830. A measurement specimen was obtained by performing a degassing treatment in a nitrogen gas flow at 0.30 MPaG and 300° C. for 20 minutes in advance and taking 4.0 g of a sample.

Method for Calculating Average Particle Size d1

The average particle size d1 [μm] may be calculated from the specific surface area according to the BET method, according to the following expression:

$$d1 = 6/(V \times G)$$

wherein V represents the specific surface area [μm$^2$/g] of a measurement subject material, as determined according to an air permeability method, and G represents the density [g/μm$^3$]. G was measured with MAT-7000 (Seishin Enterprise Co., Ltd.).

Measurement of Oxygen Content Rate

The oxygen content rate of each of the phosphors obtained in Examples and Comparative Examples was measured with an oxygen/nitrogen analyzer (EMGA-920 manufactured by Horiba Ltd.). The measurement was made by placing such each phosphor of Examples and Comparative Examples in a graphite crucible, removing any surface adsorbate at 280° C., then raising the temperature to 2400° C., and subtracting the oxygen content rate as the background, obtained in a treatment in an empty graphite crucible in the same conditions in advance, from the oxygen content rate measured, to thereby obtain the oxygen content rate in the fired product.

Measurement of Light Absorptivity at 455 nm, Internal Quantum Efficiency, External Quantum Efficiency, Peak Wavelength, and Light Absorptivity at 700 nm The light absorptivity at 455 nm, the internal quantum efficiency, and the external quantum efficiency of each of the phosphors of Examples and Comparative Examples were calculated according to the following procedure.

In other words, such each phosphor of Examples and Comparative Examples, to be measured, was packed in a concave cell so that the surface was smooth, and was attached to an opening of an integrating sphere. Monochromatic light at a wavelength of 455 nm, dispersed from a light-emitting source (Xe lamp), was introduced as excitation light of such each phosphor into the integrating sphere by use of an optical fiber. A phosphor specimen was irradiated with the monochromatic light, and a fluorescent spectrum of the specimen was measured with a spectrophotometer (MCPD-7000 manufactured by Otsuka Electronics Co., Ltd.). The number of photons of excitation reflection light (Qref) and the number of photons of fluorescence (Qem) were calculated from the resulting spectral data. The number of photons of excitation reflection light was measured in the same wavelength range as in the number of photons of excitation light, and the number of photons of fluorescence was measured in the range from 465 to 800 nm.

The same apparatus was used, a standard reflector plate (Spectralon (registered trademark) manufactured by Labsphere, Inc.) having a reflectance of 99% was attached to an opening of an integrating sphere, and a spectrum of excitation light at a wavelength of 455 nm was measured. The number of photons of excitation light (Qex) was calculated from a spectrum in the wavelength range from 450 to 465 nm.

The light absorptivity at 455 nm and the internal quantum efficiency of each of the phosphors of Examples and Comparative Examples were determined according to the following calculation expressions.

Light absorptivity at 455 nm=(($Q$ex−$Q$ref)/$Q$ex)×100

Internal quantum efficiency=($Q$em/($Q$ex−$Q$ref))×100

The external quantum efficiency was determined by the following calculation expression.

External quantum efficiency=($Q$em/$Q$ex)×100

Accordingly, the external quantum efficiency satisfied the following relationship from the above expressions.

External quantum efficiency=Light absorptivity at 455 nm×Internal quantum efficiency The peak wavelength of each of the phosphors of Examples and Comparative Examples was defined as the wavelength at which the highest intensity was exhibited in the range from 465 nm to 800 nm in the spectral data obtained by attaching such each phosphor to an opening of an integrating sphere.

The half-value width of each of the phosphors of Examples and Comparative Examples was defined as the difference in wavelength between a longer wavelength and a shorter wavelength at which the respective intensities were each half the intensity at the peak wavelength, in the spectrum appearing in the range from 465 nm to 800 nm in the spectral data obtained by attaching such each phosphor to an opening of an integrating sphere.

In a case where a standard specimen (NIMS Standard Green lot No. NSG1301, manufactured by Sialon Co., Ltd.) of such each β-type sialon phosphor was subjected to measurement by the above measurement methods, the light absorptivity at 455 nm was 74.4%, the internal quantum efficiency was 74.8%, the external quantum efficiency was 55.6%, the peak wavelength was 543 nm, and the half-value width was 53 nm. The respective measurement values of the light absorptivity at 455 nm, the internal and external quantum efficiencies, and the peak wavelength were varied in some cases due to the changes of manufactures, production lot numbers, and the like of the measurement apparatuses, and thus such respective measurement values were each corrected with the measurement value with respect to the standard specimen of the β-type sialon phosphor, as a standard value, in a case where manufactures, production lot numbers, and the like of the measurement apparatuses were changed.

The light absorptivity at 700 nm of each of the phosphors of Examples and Comparative Examples was measured according to the following procedure. In other words, a standard reflector plate (Spectralon (registered trademark) manufactured by Labsphere, Inc.) having a reflectance of 99% was installed to an opening of an integrating sphere, monochromatic light at a wavelength of 700 nm, dispersed from a light-emitting source (Xe lamp), was introduced into the integrating sphere by use of an optical fiber, and a reflection light spectrum was measured with a spectrophotometer (MCPD-7000 manufactured by Otsuka Electronics Co., Ltd.). The number of photons of incident light (Qex(700)) was here calculated from the spectrum in the wavelength range from 690 to 710 nm.

Next, each of the phosphors of Examples and Comparative Examples, to be measured, was packed in a concave cell so that the surface was smooth, and was installed to an opening of an integrating sphere and thereafter was irradiated with monochromatic light at a wavelength of 700 nm, and an incident reflection light spectrum was measured with the spectrophotometer. The number of photons of incident reflection light (Qref(700)) was calculated from the resulting spectral data. The number of photons of incident reflection light (Qref(700)) was calculated in the same wavelength range as that with respect to the number of photons of incident light (Qex(700)). The light absorptivity at 700 nm was calculated from the resulting two numbers of photons according to the following expression.

Light absorptivity at 700 nm=$((Qex(700)-Qref(700))/Qex(700))\times 100$

Variations in Total Flux and Chromaticity Y with Evaluation of LED Package

A CASN or SCASN phosphor and a silicone resin (OE6656 manufactured by Dow Corning Toray Co., Ltd.) were weighed so that the rate of such CASN or SCASN phosphor was 3% by weight, and were mixed together by a planetary centrifugal mixer (Awatori Rentaro (registered trademark) ARE-310 manufactured by Thinky Corporation). LED was mounted by placing the LED at the bottom of a concave package body, subjecting the resultant to wire bonding with an electrode on a substrate, and then injecting such each phosphor mixed with the silicone resin, through a microsyringe. After the mounting, the resultant was subjected to curing at 120° C. and then post-curing at 110° C. for 10 hours, and thus was sealed. The LED here used was one having a light-emitting peak wavelength of 448 nm and a chip size of 1.0 mm×0.5 mm. The LED package produced was subjected to measurement of the chromaticity Y with a total flux measurement system. Comparison with respect to the variation in chromaticity Y was made by producing 20 LEDs, subjecting them to measurement with a total flux measurement system according to the method for measuring the chromaticity Y of the above LED, to take the standard deviation of the chromaticity Y, and defining it as a relative value. When the standard deviation in the case of use of the CASN or SCASN phosphor of Example 2 in Table 1, Table 2, and Table 3 or in the case of use of the CASN or SCASN phosphor of Example 5 in Table 4 was assumed to be 100% in comparison of the relative value of the standard deviation of the chromaticity Y, any CASN or SCASN phosphor where the relative value of the standard deviation was 119% or more was determined to be large in variation in chromaticity Y of the LED and any CASN or SCASN phosphor where the relative value of the standard deviation was less than 119% was determined to be small in variation in chromaticity Y of the LED.

The evaluation results of the phosphors of Examples 1 to 4 and Comparative Examples 1 to 5 were shown, together with compositions and production conditions, in Tables 1 to 3, and those of Example 5 and Comparative Examples 6 to 8 were shown in Table 4 in the same manner.

TABLE 1

| | CASN phosphor | Unit | Example 1 | Example 2 | Comparative Example 1 | Comparative Example 2 |
|---|---|---|---|---|---|---|
| Composition | $Si_3N_4$ | wt % | 33.90 | 33.90 | 33.90 | 33.90 |
| | $Ca_3N_2$ | wt % | 35.61 | 35.61 | 35.61 | 35.61 |
| | AlN | wt % | 29.72 | 29.72 | 29.72 | 29.72 |
| | $Eu_2O_3$ | wt % | 0.77 | 0.77 | 0.77 | 0.77 |
| Production conditions | Firing temperature | ° C. | 1750 | 1750 | 1850 | 1850 |
| | Firing pressure | MPaG | 0.13 | 0.13 | 0.13 | 0.13 |
| | Firing time | hours | 4 | 8 | 8 | 8 |
| | Grinding by mortar | | Performed | Performed | Performed | Performed |
| | Classification by sieve | μm | 250 | 250 | 250 | 250 |
| | Acid treatment, acid liquid separation, drying | | Performed | Performed | Performed | Performed |
| | Ball mill pulverization | hours | — | — | 8 | 12 |
| | Drying | | Performed | Performed | Performed | Performed |
| | Classification by sieve | μm | 75 | 75 | 75 | 75 |
| Evaluations | (d90−d10)/d50 | — | 1.25 | 1.26 | 1.85 | 2.07 |
| | d10 | μm | 1.5 | 2.1 | 1.0 | 0.6 |
| | d50 | μm | 2.8 | 3.8 | 3.3 | 1.5 |
| | d90 | μm | 5.0 | 6.9 | 7.1 | 3.7 |
| | d100 | μm | 15.5 | 21.9 | 26.0 | 18.2 |
| | Oxygen content rate | wt % | 2.04 | 1.69 | 4.91 | 5.26 |
| | Light absorptivity at 700 nm | % | 5.2 | 3.1 | 7.8 | 7.1 |
| | BET specific surface are | $m^2/g$ | 2.22 | 3.13 | 10.24 | 8.34 |
| | Real density | $g/m^3$ | 3.90 | 3.90 | 3.90 | 3.90 |
| | Average particle size d1 | μm | 0.69 | 0.49 | 0.15 | 0.18 |

TABLE 1-continued

| CASN phosphor | Unit | Example 1 | Example 2 | Comparative Example 1 | Comparative Example 2 |
|---|---|---|---|---|---|
| d50/d1 | — | 4.04 | 7.73 | 21.96 | 8.13 |
| Light absorptivity at 455 nm | % | 71.3 | 76.2 | 59.6 | 48.4 |
| Internal quantum efficiency | % | 83.0 | 85.0 | 77.8 | 74.7 |
| External quantum efficiency | % | 59.2 | 64.8 | 46.4 | 36.2 |
| Peak wavelength | nm | 655 | 656 | 649 | 646 |
| Half-value width | nm | 91 | 90 | 90 | 90 |
| Variation in chromaticity Y of LED package | — | Small | Standard | Small | Small |

TABLE 2

| | CASN phosphor | Unit | Example 3 | Comparative Example 3 |
|---|---|---|---|---|
| Composition | Si$_3$N$_4$ | wt % | 33.90 | 33.90 |
| | Ca$_3$N$_2$ | wt % | 35.61 | 35.61 |
| | AlN | wt % | 29.72 | 29.72 |
| | Eu$_2$O$_3$ | wt % | 0.77 | 0.77 |
| Production conditions | Firing temperature | °C. | 1750 | 1850 |
| | Firing pressure | MPaG | 0.13 | 0.13 |
| | Firing time | hours | 12 | 8 |
| | Grinding by mortar | | Performed | Performed |
| | Classification by sieve | μm | 250 | 250 |
| | Acid treatment, acid liquid separation, drying | | Performed | Performed |
| | Ball mill pulverization | hours | — | 4 |
| | Drying | | Performed | Performed |
| | Classification by sieve | μm | 75 | 75 |
| Evaluations | (d90−d10)/d50 | — | 1.08 | 1.88 |
| | d10 | μm | 3.1 | 1.4 |
| | d50 | μm | 5.3 | 5.1 |
| | d90 | μm | 8.8 | 11.0 |
| | d100 | μm | 21.9 | 26.0 |
| | Oxygen content rate | wt % | 2.02 | 2.73 |
| | Light absorptivity at 700 nm | % | 2.2 | 5.9 |
| | BET specific surface area | m$^2$/g | 3.47 | 7.63 |
| | Real density | g/m$^3$ | 3.90 | 3.90 |
| | Average particle size d1 | μm | 0.44 | 0.20 |
| | d50/d1 | — | 11.95 | 25.29 |
| | Light absorptivity at 455 nm | % | 81.6 | 68.2 |
| | Internal quantum efficiency | % | 85.0 | 85.1 |
| | External quantum efficiency | % | 69.4 | 58.0 |
| | Peak wavelength | nm | 658 | 649 |
| | Half-value width | nm | 90 | 91 |
| | Variation in chromaticity Y of LED package | — | Small | Small |

45

TABLE 3

| | CASN phosphor | Unit | Example 4 | Comparative Example 4 | Comparative Example 5 |
|---|---|---|---|---|---|
| Composition | Si$_3$N$_4$ | wt % | 33.90 | 33.90 | 33.90 |
| | Ca$_3$N$_2$ | wt % | 35.61 | 35.61 | 35.61 |
| | AlN | wt % | 29.72 | 29.72 | 29.72 |
| | Eu$_2$O$_3$ | wt % | 0.77 | 0.77 | 0.77 |
| Production conditions | Firing temperature | °C. | 1750 | 1850 | 1950 |
| | Firing pressure | MPaG | 0.13 | 0.13 | 0.13 |
| | Firing time | hours | 15 | 8 | 4 |
| | Grinding by mortar | | Performed | Performed | Performed |
| | Classification by sieve | μm | 250 | 250 | 250 |
| | Acid treatment, acid liquid separation, drying | | Performed | Performed | Performed |
| | Ball mill pulverization | hours | — | 3 | — |
| | Drying | | Performed | Performed | Performed |
| | Classification by sieve | μm | 75 | 75 | 75 |
| Evaluations | (d90−d10)/d50 | — | 0.87 | 1.82 | 0.98 |
| | d10 | μm | 4.7 | 1.0 | 10.2 |
| | d50 | μm | 6.9 | 7.4 | 16.6 |
| | d90 | μm | 10.7 | 14.5 | 26.4 |

TABLE 3-continued

| CASN phosphor | Unit | Example 4 | Comparative Example 4 | Comparative Example 5 |
|---|---|---|---|---|
| d100 | μm | 21.9 | 30.9 | 61.9 |
| Oxygen content rate | wt % | 2.59 | 2.56 | 1.69 |
| Light absorptivity at 700 nm | % | 1.9 | 5.7 | 3.2 |
| BET specific surface area | m$^2$/g | 5.55 | 5.10 | 0.35 |
| Real density | g/m$^3$ | 3.90 | 3.90 | 3.90 |
| Average particle size d1 | μm | 0.28 | 0.30 | 4.40 |
| d50/d1 | — | 24.89 | 24.53 | 3.78 |
| Light absorptivity at 455 nm | % | 84.8 | 74.7 | 88.2 |
| Internal quantum efficiency | % | 87.4 | 78.0 | 88.2 |
| External quantum efficiency | % | 74.1 | 58.3 | 77.8 |
| Peak wavelength | nm | 654 | 651 | 655 |
| Half-value width | nm | 89 | 89 | 90 |
| Variation in chromaticity Y of LED package | — | Small | Small | Large |

TABLE 4

| | SCASN phosphor | Unit | Example 5 | Comparative Example 6 | Comparative Example 7 | Comparative Example 8 |
|---|---|---|---|---|---|---|
| Composition | Si$_3$N$_4$ | wt % | 25.53 | 25.53 | 26.49 | 26.49 |
| | Ca$_3$N$_2$ | wt % | 2.43 | 2.43 | 4.90 | 4.90 |
| | Sr$_2$N | wt % | 43.91 | 43.91 | 42.89 | 42.89 |
| | AlN | wt % | 22.38 | 22.38 | 23.22 | 23.22 |
| | Eu$_2$O$_3$ | wt % | 5.76 | 5.76 | 2.49 | 2.49 |
| Production conditions | Firing temperature | °C. | 1950 | 1950 | 1900 | 1900 |
| | Firing pressure | MPaG | 0.80 | 0.80 | 0.80 | 0.80 |
| | Firing time | hours | 8 | 8 | 8 | 8 |
| | Grinding by mortar | | — | — | Performed | Performed |
| | Ball mill pulverization | hours | 5 | 5 | — | — |
| | Classification by sieve | μm | 250 | 250 | 250 | 250 |
| | Acid treatment, acid liquid separation, drying | | Performed | Performed | Performed | Performed |
| | Decantation | | Performed | — | Performed | — |
| | Drying | | Performed | Performed | Performed | Performed |
| | Classification by sieve | μm | 75 | 75 | 75 | 75 |
| Evaluations | (d90-d10)/d50 | — | 1.69 | 2.51 | 1.22 | 1.21 |
| | d10 | μm | 1.9 | 0.9 | 9 | 8.5 |
| | d50 | μm | 4.8 | 3.9 | 14.2 | 14.2 |
| | d90 | μm | 10.0 | 10.7 | 23.4 | 23.3 |
| | d100 | μm | 61.8 | 36.8 | 61.8 | 61.8 |
| | Oxygen content rate | wt % | 2.04 | 3.00 | 2.38 | 2.55 |
| | Light absorptivity at 700 nm | % | 11.4 | 10.0 | 4.7% | 4.0% |
| | BET specific surface area | m$^2$/g | 1.56 | 3.77 | 3.00 | 3.00 |
| | Real density | g/m$^3$ | 3.90 | 3.90 | 3.90 | 3.90 |
| | Average particle size d1 | μm | 0.99 | 0.41 | 2.78 | 2.78 |
| | d50/d1 | — | 4.87 | 9.56 | 23.79 | 23.79 |
| | Light absorptivity at 455 nm | % | 94.1 | 90.2 | 96.5 | 95.9 |
| | Internal quantum efficiency | % | 74.5 | 73.4 | 78.8 | 79.1 |
| | External quantum efficiency | % | 70.1 | 66.2 | 76.0 | 75.9 |
| | Peak wavelength | nm | 633 | 633 | 639 | 638 |
| | Half-value width | nm | 80 | 81 | 85 | 85 |
| | Variation in chromaticity Y of LED package | — | Standard | Small | Large | Large |

The light absorptivity at 455 nm of the CASN or SCASN phosphor depends on the particle size. This is based on the following: a small particle size leads to an increased specific surface area and a large effect of reflection and scattering, thereby resulting in a reduction in light absorptivity of light at a wavelength of 455 nm, as excitation light. Here, any Example and any Comparative Example which were close in the value of d50 were comparison targets. In other word, Table 1 to Table 4 each represented a combination of any Example and any Comparative Example which were close in the value of d50, for comparison each other.

Discussion

First, in comparison of Example 1 and Comparative Example 1 in Table 1, both the Examples exhibited median sizes d50 closer to each other, but Example 1 exhibited a small span value (d90−d10)/d50 and a small value of d50/d1 in a particle size distribution. It was thus found that there was a small amount of the ultrafine particle in Example 1 as compared with Comparative Example 1. Accordingly, Example 1 exhibited less light scattering/reflection due to the ultrafine particle and thus a high light absorptivity at 455 nm. There was a small amount of any ultrafine particle which was considered to have many defects absorbing light, and thus the internal quantum efficiency was high.

Comparative Example 2 exhibited a small d50 due to the ball mill pulverization performed for a longer time than that of Comparative Example 1, but exhibited a large span value and a small d10 in a particle size distribution, and thus included a large amount of the ultrafine particle. Thus, Comparative Example 2 was further strongly affected by the ultrafine particle as compared with Comparative Example 1, and thus exhibited a lowered light absorptivity at 455 nm and a lowered internal quantum efficiency.

In comparison of Example 3 with Comparative Example 3 in Table 2, both the Examples each exhibited a value of d50 around 5.0 μm, but Example 3 exhibited a smaller span value and a smaller value of d50/d1 in a particle size distribution. It was thus found that there was a small amount of the ultrafine particle in Example 3 as compared with Comparative Example 3. Example 3 was less affected by the ultrafine particle, and thus exhibited a remarkably high light absorptivity at 455 nm.

In comparison of Example 4 with Comparative Example 4 in Table 3, both the Examples each exhibited a value of d50 around 7.0 μm, but Example 4 exhibited a smaller span value and a larger value of d10 in a particle size distribution. Thus, there was a small amount of the ultrafine particle in Example 4 as compared with Comparative Example 4. Therefore, Example 4 was less affected by the ultrafine particle than Comparative Example 4, and thus exhibited a high light absorptivity at 455 nm and a high internal quantum efficiency.

Comparative Example 5 included firing at an increased firing retention temperature and thus promotion of particle growth, and resulted in the synthesis of a phosphor having a large particle size. Comparative Example 5, when compared with Example 1, exhibited a large value of d50, a high light absorptivity at 455 nm and a high internal quantum efficiency. However, the value of d50 was as large as 10.0 μm or more and thus was not suitable for a micro LED and a phosphor sheet. A micro LED has a size of 100 μm or less and a phosphor layer is often set to have a size of 50 μm or less. Thus, a sheet having a thickness of 50 μm is demanded to be favorable in processability. However, Comparative Example 5 had a large amount of a coarse particle and exhibited poor processability of a sheet having a thickness of 50 μm. Furthermore, a large particle size leaded to the variation in amount of the phosphor to be added to a LED and also the variation of the state of dispersion in a LED, and thus Comparative Example 5 exhibited a large variation in chromaticity Y of a LED package.

Both Example 5 and Comparative Example 6 in Table 4 each provided the SCASN phosphor and exhibited a d50 of 10.0 μm or less, but Example 5 exhibited a smaller span value, a smaller d50/d1, and a larger value of d10, and thus Example 5 included a smaller amount of the ultrafine particle. Thus, Example 5 was less affected by the ultrafine particle than Comparative Example 6, and thus exhibited a high light absorptivity at 455 nm and a high internal quantum efficiency.

In comparison of Comparative Example 7 with Comparative Example 8, Comparative Example 7 performed classification by decantation, but both the Examples each exhibited a large d50 of 10.0 μm or more, and thus there were very small differences in light absorptivity at 455 nm and internal quantum efficiency from those of Comparative Example 8 where no classification was performed. A micro LED has a size of 100 μm or less and a phosphor layer is often set to have a size of 50 μm or less. Thus, a sheet having a thickness of 50 μm is demanded to be favorable in processability. However, both Comparative Example 7 and Comparative Example 8 each exhibited a large d50 of 10.0 μm or more and exhibited poor processability of a sheet having a thickness of 50 μm. Furthermore, a large particle size leaded to the variation in amount of the phosphor to be added to a LED and also the variation of the state of dispersion in a LED, and thus the variation in chromaticity Y of a LED package was large.

INDUSTRIAL APPLICABILITY

The phosphor of the invention, and a phosphor and a light-emitting device produced according to the production method of the invention are each used for a white light-emitting device and a colored light-emitting device. The white light-emitting device of the invention is used for a liquid crystal display, a micro-LED display, a mini-LED display, a backlight of a liquid crystal panel, a lighting device, a signal device, and an image display device. It is also used in a projector application.

The invention claimed is:

1. A phosphor which has a main crystal phase having the same crystal structure as that of $CaAlSiN_3$ and which is represented by general formula $MAlSiN_3$:Eu where M represents one or more elements selected from Sr, Mg, Ca, and Ba, wherein
    the phosphor satisfies conditions of a span value (d90−d10)/d50 of 1.70 or less, a d50 of 7.5 μm or less, and a d90 of 9.0 m or less, as represented with d10, d50, and d90 (each unit is [μm]) on a volume frequency basis in a particle size distribution measured according to a laser diffraction scattering method;
    wherein the d10, d50, and d90 on a volume frequency basis in a particle size distribution measured according to the laser diffraction scattering method are each a measurement value obtained with a liquid obtained by loading 0.5 g of a phosphor for measurement, into 100 ml of a solution of 0.05% by weight of sodium hexametaphosphate mixed in ion exchange water, and subjecting the resultant to a dispersing treatment for 3 minutes with an ultrasonic homogenizer at an oscillation frequency of 19.5±1 kHz, a chip size of 20φ, and an amplitude of vibration of 32±2 μm, with a chip being placed at a central portion of the liquid, and
    wherein a value of d50/d1 represented by the d50 and an average particle size d1 calculated from a specific surface area measured according to a BET method is 21.0 or less.

2. The phosphor according to claim 1, wherein an oxygen content rate is 2.70% by mass or less.

3. The phosphor according to claim 1, wherein a light absorptivity at 700 nm is 5.5% or less.

4. The phosphor according to claim 1, wherein a particle size d100 at an accumulation of 100% on a volume basis in a particle size distribution measured according to a laser diffraction scattering method is 24.0 m or less.

5. A light-emitting device comprising a LED, a phosphor sheet, or a phosphor plate comprising the phosphor according to claim 1.

* * * * *

UNITED STATES PATENT AND TRADEMARK OFFICE
CERTIFICATE OF CORRECTION

PATENT NO. : 11,434,421 B2
APPLICATION NO. : 17/272878
DATED : September 6, 2022
INVENTOR(S) : Kazuya Sugita et al.

It is certified that error appears in the above-identified patent and that said Letters Patent is hereby corrected as shown below:

In the Claims

Claim 1, Column 18, Line 29, "9.0 m" should be ---9.0 µm---.

Claim 4, Column 18, Line 56, "24.0 m" should be ---24.0 µm---.

Signed and Sealed this
Twenty-second Day of November, 2022

Katherine Kelly Vidal
*Director of the United States Patent and Trademark Office*